(12) United States Patent
Xu et al.

(10) Patent No.: US 11,348,486 B2
(45) Date of Patent: May 31, 2022

(54) FLEXIBLE DISPLAY DEVICE

(71) Applicants: Hefei BOE Optoelectronics Technology Co., Ltd., Anhui (CN); BOE Technology Group Co., Ltd., Beijing (CN)

(72) Inventors: Zhaozhe Xu, Beijing (CN); Zhiyang Gao, Beijing (CN)

(73) Assignees: Hefei BOE Optoelectronics Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 198 days.

(21) Appl. No.: 16/642,048

(22) PCT Filed: Apr. 15, 2019

(86) PCT No.: PCT/CN2019/082758
§ 371 (c)(1),
(2) Date: Feb. 26, 2020

(87) PCT Pub. No.: WO2019/228088
PCT Pub. Date: Dec. 5, 2019

(65) Prior Publication Data
US 2021/0035476 A1 Feb. 4, 2021

(30) Foreign Application Priority Data
May 31, 2018 (CN) .......................... 201810571147.4

(51) Int. Cl.
*G09F 9/30* (2006.01)
*H01L 51/00* (2006.01)
(52) U.S. Cl.
CPC .......... *G09F 9/301* (2013.01); *H01L 51/0097* (2013.01)

(58) Field of Classification Search
CPC .............................. G09F 9/301; H01L 51/0097
See application file for complete search history.

(56) References Cited

U.S. PATENT DOCUMENTS

| 2013/0265631 | A1 | 10/2013 | Ahn et al. |
| 2014/0015402 | A1 | 1/2014 | Ahn et al. |
| 2018/0323385 | A1 | 11/2018 | Liu et al. |

FOREIGN PATENT DOCUMENTS

| CN | 103545340 A | 1/2014 |
| CN | 106155412 A | 11/2016 |
| CN | 106448465 A | 2/2017 |
| CN | 106875850 A | 6/2017 |
| CN | 107170374 A | 9/2017 |

(Continued)

OTHER PUBLICATIONS

Chinese Office Action in corresponding application No. 201810571147.4 dated Jul. 9, 2019.

(Continued)

*Primary Examiner* — Vip Patel
(74) *Attorney, Agent, or Firm* — ArentFox Schiff LLP; Michael Fainberg (57) ABSTRACT

A flexible display device relating to the technical field of displays. The flexible display device comprises: a flexible substrate; a flexible rigid transformative layer, formed at one side of the flexible substrate, comprising a transformative film capable of transforming between a flexible and a rigid state under the action of an electric field; and an electrode layer for forming the electric field used to drive changes in the transformative film.

8 Claims, 5 Drawing Sheets

(56) References Cited

FOREIGN PATENT DOCUMENTS

| | | |
|---|---|---|
| CN | 107204398 A | 9/2017 |
| CN | 107316566 A | 11/2017 |
| CN | 108520917 A | 9/2018 |

OTHER PUBLICATIONS

Chinese Office Action in corresponding application No. 201810571147.4 dated Feb. 3, 2020.
Decision of Rejection for corresponding application No. 201810571147.4 dated Jul. 14, 2020.

FLEXIBLE DISPLAY DEVICE

This application is a US National Stage of International Application No. PCT/CN2019/082758, filed on Apr. 15, 2019, which claims priority to Chinese Patent Application No. 201810571147.4, filed with Chinese Patent Office on May 31, 2018, entitled "Flexible display device", the entire content of which is incorporated herein by reference.

FIELD

The present disclosure relates to the technical field of display, in particular to a flexible display device.

BACKGROUND

Flexible display devices are display devices which are made of flexible materials and are flexible. Due to the excellent display characteristics such as flexibility and lightness, the flexible display devices can be applied to many fields such as wearable devices, mobile devices and augmented reality and virtual technology devices and are considered to be the mainstream in future display fields.

Flexible display devices are usually made into a structure that can be rolled up or folded in a non-operating state and unfolded during operation. However, substrate materials of the flexible display devices are liable to be damaged during a manual rolling-up/folding process, and after long-term folding/rolling-up storage, problems such as irreversible deformation, creasing or warping also occur, which lead to unevenness after the substrate materials are unfolded, thus display effects of displays are affected. Meanwhile, the unevenness of substrates also affects the working characteristics and the service life of internal structures of the displays, and therefore the reliability of the displays is reduced.

SUMMARY

The present disclosure provides a flexible display device. The specific solution is as follows.

The flexible display device includes:
a flexible substrate; and
a flexiblity-rigidity transformation layer disposed on one side of the flexible substrate, where,
the flexiblity-rigidity transformation layer includes an electrode layer and a transformation film capable of transforming between a flexiblity state and a rigidity state under the action of an electric field; and the electrode layer is used for generating the electric field for driving the transformation film to transform between the flexiblity state and the rigidity state.

The present disclosure provides the flexible display device. The above flexible display device includes the flexible substrate and the flexiblity-rigidity transformation layer formed on one side of the flexible substrate. The flexiblity-rigidity transformation layer includes the transformation film and the electrode layer. Specifically, after the electrode layer generates the electric field for transforming the transformation film from the flexiblity state to the rigidity state, the transformation film stretches in a direction perpendicular to the electric field, the elastic modulus changes, a film layer stretches and is paved flatly, and since the flexiblity-rigidity transformation layer is formed on the flexible substrate, the flexible substrate is paved flatly correspondingly, and thus the effect of flattening the flexible substrate can be achieved. In addition, the transformation film in the electric field can be transformed from the rigidity state to the flexiblity state by adjusting the electrode layer, then the flexible substrate loses support, and thus a user need of rolling-up or bending the flexible display device can be met. In addition, elastic parameters of the transformation film can be changed under the action of the electric field, and the transformation film is changed from the flexible layer to the rigid layer, so that planarization of the flexible substrate is achieved. Through transformation of the transformation film, damage of the flexible substrate during repeated rolling-up and unfolding processes can be reduced, so that the service life of the display device is prolonged, and the display quality is improved.

DETAILED DESCRIPTION OF THE EMBODIMENTS

The technical solutions in the embodiments of the present disclosure will be clearly and completely described below in combination with the accompanying drawings in embodiments of the present disclosure. Obviously, the described embodiments are only a part of the embodiments of the present disclosure, but not all of the embodiments. All other embodiments obtained by those skilled in the art without creative labor based on the embodiments of the present disclosure fall within the scope of protection of the present disclosure.

Figure 1:
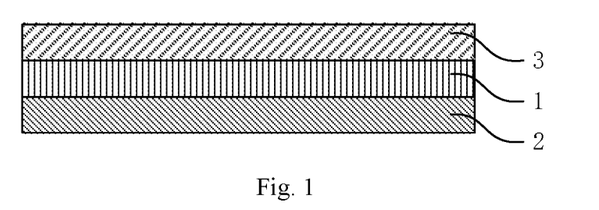
FIG. 1 is a schematic structural diagram of a flexible display device provided by embodiments of the present disclosure.

The present disclosure provides a flexible display device, as shown in FIG. 1, including:
a flexible substrate 1; and
a flexiblity-rigidity transformation layer 2 disposed on one side of the flexible substrate 1, where,
the flexiblity-rigidity transformation layer 2 includes: an electrode layer 22 and a transformation film 21 capable of transforming between a flexibility state and a rigidity state under the action of an electric field; and the electrode layer 22 is used for generating the electric field for driving the transformation film 21 to transform between the flexiblity state and the rigidity state.

The present disclosure provides the flexible display device. The flexible display device includes the flexible substrate 1 and the flexiblity-rigidity transformation layer 2 formed on one side of the flexible substrate 1. The flexiblity-rigidity transformation layer 2 includes the transformation film 21 and the electrode layer 22. Specifically, after the electrode layer 22 generates the electric field for transforming the transformation film 21 from the flexiblity state to the rigidity state, the transformation film 21 stretches in a direction perpendicular to the electric field, the elastic modulus changes, the film layer stretches and is paved flatly, and since the flexiblity-rigidity transformation layer 2 is formed on the flexible substrate 1, the flexible substrate 1 is paved flatly correspondingly, and thus the planarization of substrate 1 can be achieved; and afterwards, the transformation film 21 in the electric field can be transformed from the rigidity state to the flexiblity state by adjusting the electrode layer 22, the flexible substrate 1 loses support at the moment, and therefore a user need of rolling-up or bending the flexible display device can be met.

Elastic parameters of the transformation film 21 of the flexible display device provided by the present disclosure can be changed under the action of the electric field, and a flexible layer is changed into a rigid layer, so that planarization of the flexible substrate 1 is achieved. Through transformation of the transformation film 21, damage of the flexible substrate during repeated rolling-up and unfolding processes can be reduced, so that the service life of the display device is prolonged, and the display quality is improved.

Therefore, according to the above display device, the service life of the flexible substrate 1 can be prolonged, a display effect of the display device can be improved, and the reliability of the display device can be improved.

Figure 2:
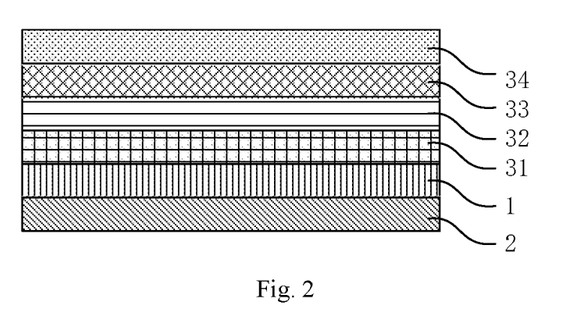
FIG. 2 is another schematic structural diagram of the flexible display device provided by an embodiment of the present disclosure.

It should be noted that the flexible substrate 1 is provided with a display component 3, and the display component 3 may be an organic electroluminescent display device or a flexible liquid crystal display device, etc. Specifically, referring to FIG. 2, the display component 3 can specifically and structurally includes a thin film transistor switch 31, a light emitting layer 32, an encapsulation layer 33 and a protective layer 34 which are sequentially arranged in a direction facing away from the flexible substrate 1. In addition, the display component 3 may further be internally provided with a control chip for controlling a normal display function of the display component 3, which is not specifically limited herein.

It should be noted that the flexiblity-rigidity transformation layer 2 can be disposed between the flexible substrate 1 and the display component 3, or the flexiblity-rigidity transformation layer 2 can be disposed on one side, facing away from the flexible substrate 1, of the display component 3, or the flexiblity-rigidity transformation layer 2 is disposed on one side, facing away from the display component 3, of the flexible substrate 1. As a preferred embodiment, the arrangement that the flexiblity-rigidity transformation layer 2 is disposed on one side, facing away from the display component 3, of the flexible substrate 1 is selected.

Optionally, according to the flexible display device provided by the embodiment of the present disclosure, the flexible substrate 1 may be made of an organic or inorganic flexible material, and specifically, may be made of polyimide, polyethylene naphthalate, polyethylene glycol terephthalate, a metal film or other bendable substrate materials, which is not specifically limited herein.

Optionally, according to the flexible display device provided by the embodiment of the present disclosure, the transformation film 21 in the flexiblity-rigidity transformation layer 2 may be made of a dielectric elastic material, and the elastic parameters may change when power is applied, and the transformation film 21 is transformed from the flexiblity state to the rigidity state.

Specifically, preparation materials of the transformation film 21 may be selected from polymer materials such as silicone rubber materials, acrylate materials and carbon nanotube materials, and in an actual preparation process, a precursor material is coated by the methods such as screen printing, surface coating and digital printing and cured into a film by thermal curing or ultraviolet curing.

It should be noted that since the preparation materials of the transformation film 21 are commonly used in industry and the preparation process is relatively mature, so that the manufacturing difficulty of the flexible display device provided by the present disclosure can be lowered, and the production efficiency can be improved.

During specific implementation, a preparation material of the electrode layer 22 may be a non-metallic conductive material, such as indium tin oxide, aluminum-doped zinc oxide or other non-metallic conductive materials, and a film can be made by the methods such as splashing and evaporation when the non-metallic conductive material is adopted, or the preparation material of the electrode layer 22 may be a metal conductive material, such as Au, Ag Cu and Fe, and a film can be made by the methods such as evaporation when the metal conductive material is adopted.

Figure 3:
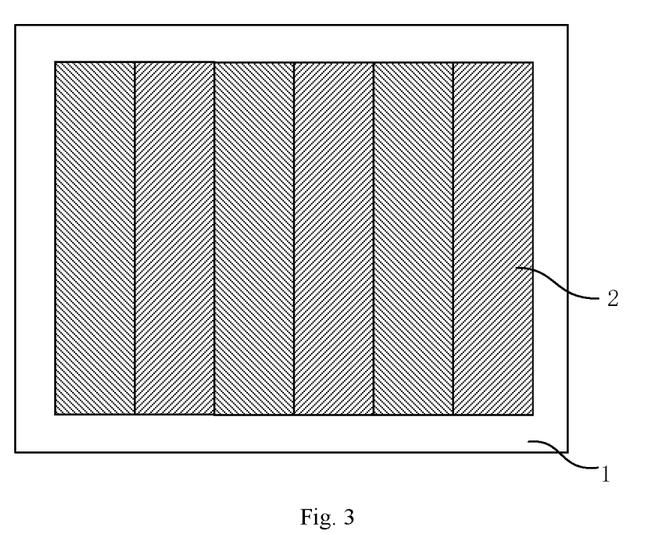
FIG. 3 is a schematic structural diagram of Structure 1 provided by an embodiment of the present disclosure.

On the basis of the above technical solution, it should be noted that the flexiblity-rigidity transformation layer 2 can be formed in various structures, and specifically in at least one of the following structures:

Structure 1:

Referring to FIG. 3, the transformation film 21 includes a plurality of transformation units, the plurality of transformation units are arranged in a rollable direction of the flexible substrate 1, and the transformation units are insulated from each other.

It should be noted that, in the above structure, the plurality of transformation units allow regional control on planarization of the flexible substrate 1. Each transformation unit can control the planarization of the part, corresponding to the transformation unit, of the flexible substrate 1, and intervals of the plurality of transformation units are determined by the insulation characteristics of an insulating material, which is not limited here.

Figure 4:
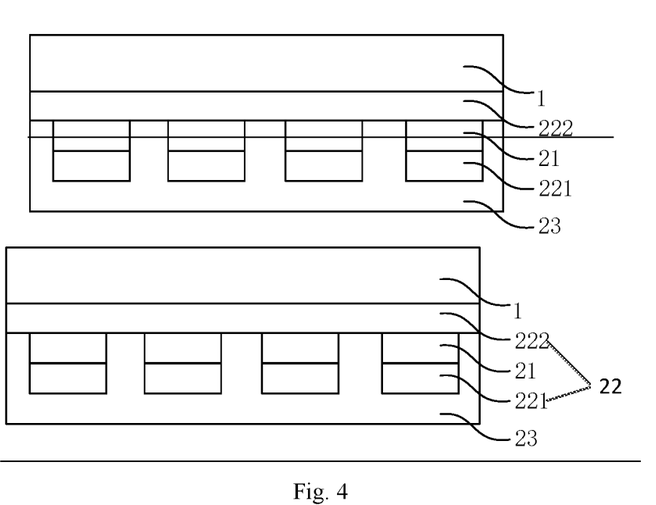
FIG. 4 is a schematic structural schematic diagram of Form 1 provided by an embodiment of the present disclosure.

Based on the above technical solution, it should be noted that when the transformation film 21 includes the plurality of transformation units, the electrode layer 22 may be arranged in a plurality of forms, and arranged in at least one of the following two forms:

Form 1: referring to FIG. 4, the electrode layer 22 includes a first electrode layer 221 and a second electrode layer 222, and the first electrode layer 221 includes a plurality of first electrode units corresponding to the transformation units in a one-to-one manner, and the transformation units are disposed between the corresponding first electrode units and the second electrode layer 222.

During specific implementation, the first electrode layer may be an anode layer, and the second electrode layer is a cathode layer; or the first electrode layer is a cathode layer, and the second electrode layer is an anode layer.

Optionally, in the flexible display device provided by the embodiment of the present disclosure, the first electrode units are disposed on one side, facing away from the flexible substrate 1, of the transformation units, and the second electrode layer 222 is disposed on one side, facing to the flexible substrate 1, of the transformation film 21.

Figure 5:
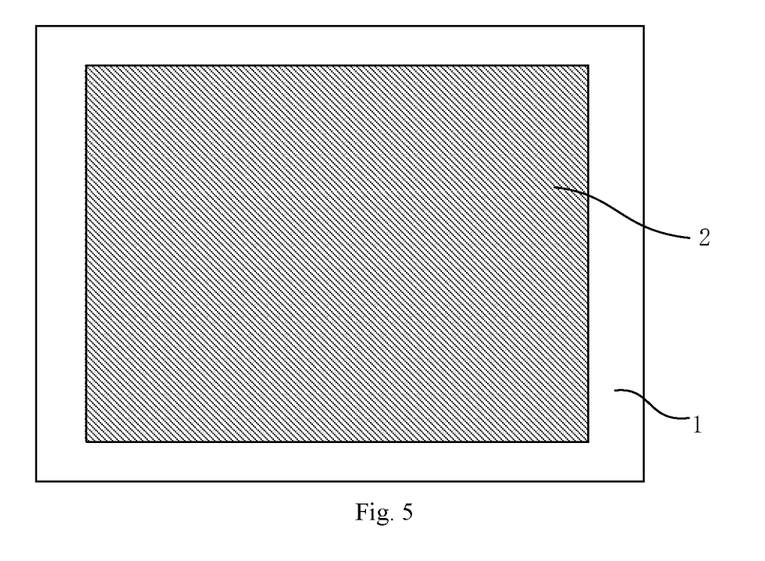
FIG. 5 is a schematic structural diagram of Structure 2 provided by an embodiment of the present disclosure.

Structure 2:

Referring to FIG. 5, the transformation film 21 includes one transformation unit.

It should be noted that the transformation film 21 includes only one transformation unit, that is, the whole transformation film 21 is paved on one side of the flexible substrate 1 to allow the planarization of the flexible substrate 1.

Figure 6:
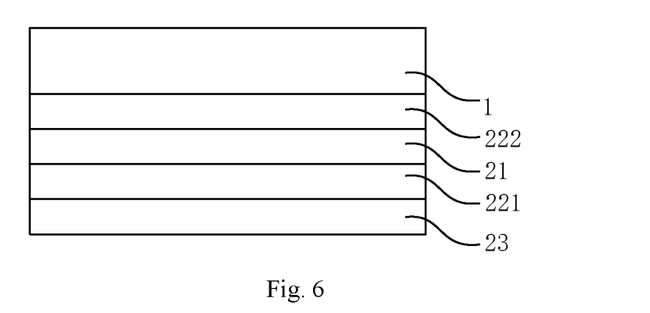
FIG. 6 is a schematic structural diagram of Form 3 provided by an embodiment of the present disclosure.

On the basis of the above technical solution, it should be noted that when the transformation film 21 includes a transformation unit, the electrode layer 22 may be arranged in a plurality of forms and arranged in at least one of the following two forms:

Form 2: referring to FIG. 6, the electrode layer 22 includes a first electrode layer 221 and a second electrode layer 222, and the first electrode layer 221 and the second electrode layer 222 are disposed on two sides of the transformation film 21 respectively.

Figure 7:
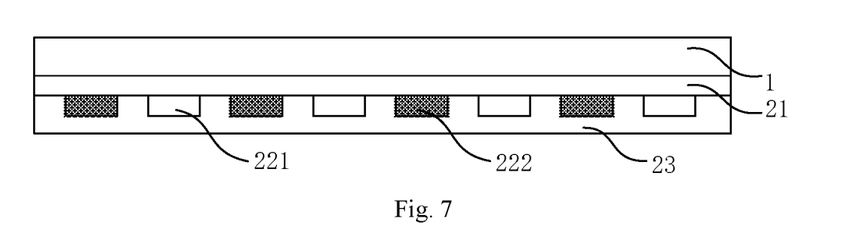
FIG. 7 is a schematic structural diagram of Form 4 provided by an embodiment of the present disclosure.

Form 3: referring to FIG. 7, the electrode layer 22 includes a first electrode layer 221 and a second electrode layer 222, the first electrode layer 221 and the second electrode layer 222 are disposed on the same side of the transformation film 21, the first electrode layer 221 includes a plurality of first electrode units, the second electrode layer 222 includes a plurality of second electrode units, and the plurality of second electrode units and the plurality of first electrode units are arranged at intervals and are alternately arranged on the same layer.

It should be noted that when the electrode layer 22 in the Form 3 is prepared, the first electrode layer 221 and the second electrode layer 222 may be formed by etching or coating.

On the basis of the above technical solution, in order to achieve the effects of planarization of the surface and protecting electrodes, as an optional embodiment, the flexiblity-rigidity transformation layer 2 further includes a planarization layer 23 for improving flatness, and the planarization layer 23 is disposed on one sides, facing away from the flexible substrate 1, of the transformation film 21 and the electrode layer 22, as shown in FIG. 4, FIG. 6 and FIG. 7, for example.

Since there are many possibilities for a positional relationship between the electrode layer 22 and the transformation film 21 in the above technical solutions, specifically, taking the side close to the flexible substrate as a inner side, the planarization layer 23 is disposed on outermost layers of all film layers of the flexiblity-rigidity transformation layer 2.

It should be noted that inorganic films such as silicon nitride films or other organic films with protective effects may be used as the planarization layer 23, and a specific preparation method may be a plasma enhanced chemical vapor deposition method, an atomic layer deposition method or other methods.

Figure 8:
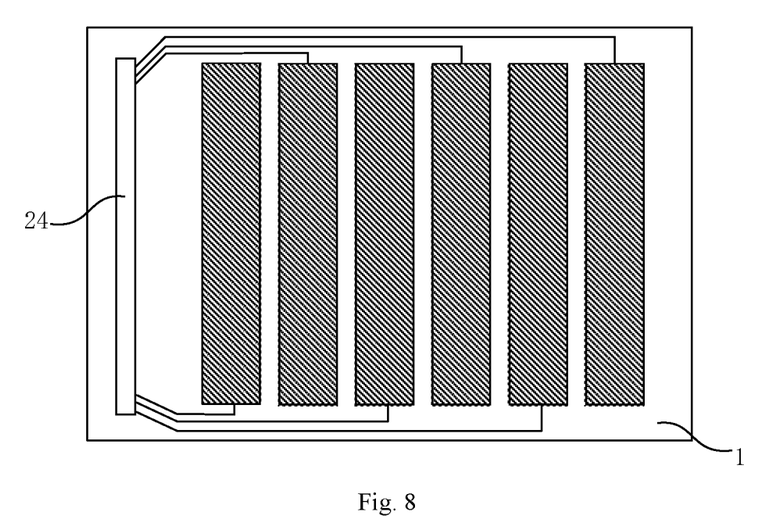
FIG. 8 is another schematic structural diagram of the display device provided by an embodiment of the present disclosure.
Figure 9:
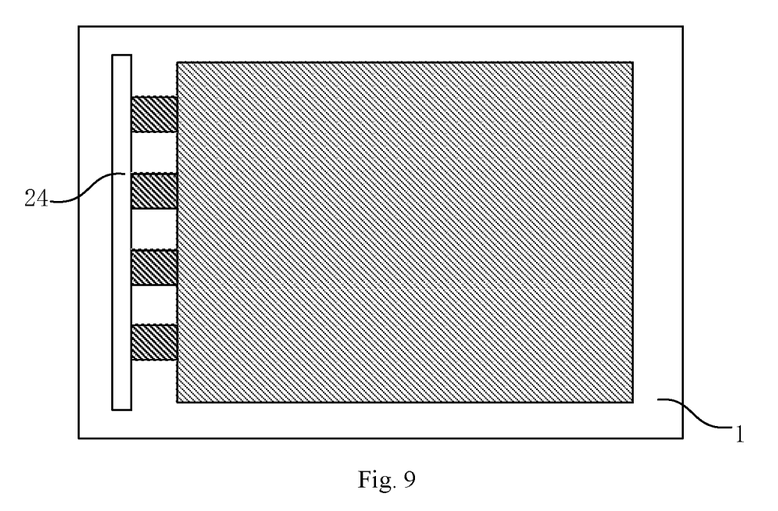
FIG. 9 is another schematic structural diagram of the display device provided by an embodiment of the present disclosure.

In addition, the flexiblity-rigidity transformation layer 2 may further include a control module 24 responsible for outputting a signal required for transformation of the transformation film 21 between the flexiblity state and the rigidity state. The electric signal output by the control module 24 can be transmitted to the electrode layer 22 through an electric wire and applied to the transformation film 21, as illustrated in FIG. 8 and FIG. 9.

Based on the above technical solution, the electric signal output by the control module 24 may be a pulse signal. Specifically, the electrode layer 22 generates an electric field after receiving a pulse voltage signal of the control module 24, the transformation film 21 stretches in a direction perpendicular to the electric field, the elastic modulus changes, the film layer stretches and is paved flatly, since the flexiblity-rigidity transformation layer 21 adheres to the flexible substrate 1, the flexible substrate 1 is paved flatly correspondingly, and thus the effect of planarization of the flexible substrate can be achieved.

It should be noted that the transformation film 21 can maintain rigidity for a certain period of time after being applied with the electric signal until next pulse voltage is applied, the interval time of applying the pulse voltage should be shorter than or equal to the rigidity maintaining time of the transformation layer, and the specific interval time and the voltage amplitude need to be comprehensively formulated according to material structures, doping conditions and other conditions.

In addition, the control module 24 may also be integrated in a control system or a control chip of the display component 3 of the flexible display device provided by the present disclosure.

On the basis of the above technical solution, the flexible display device provided by the present disclosure further includes a fixed shaft located at one end of the flexible substrate 1. The flexible substrate 1 has an unfolded state and a rolled-up state with the fixed shaft as a reel.

It should be noted that the fixed shaft is of a cylindrical structure, and the display component 3 is disposed on one side, facing to the fixed shaft, of the flexible substrate 1. When the flexible substrate 1 needs to be rolled up relative to the fixed shaft, the flexible substrate 1 and the display component 3 and the flexiblity-rigidity transformation layer 2 on the flexible substrate 1 are rolled up around a center point of the fixed shaft.

Based on the above technical solution, the flexible display device provided by the present disclosure further includes a rolling-up device for controlling the flexible substrate 1 to change between the unfolded state and the rolled-up state, and a driving system for driving the action of the rolling-up device.

In order to reduce the size of the flexible display device provided by the present disclosure, as an optional embodiment, the rolling-up device and the driving system are located on the fixed shaft, and the driving system may be selected from an air compression system or other mobile power systems.

In addition, a fixed shaft control system for controlling the operation of the driving system may also be arranged in the fixed shaft. The fixed shaft control system may include a control circuit, a mobile control panel, etc. A user can adjust the rolling-up, unfolding and projection operations of a display composed of the flexible substrate 1, the display component 3 and the flexiblity-rigidity transformation layer 2 through the fixed shaft control system, and adjust the actual display size and resolution of the display. Certainly, the user can also roll up the display with the fixed shaft as the center by manual rolling-up.

On the basis of the above technical solution, the length and radius of the fixed shaft may be fixed, or the size of the fixed shaft may be adjustable in a radial direction; and/or the size of the fixed shaft may be adjustable in an extending direction of the fixed shaft.

It should be noted that the size of the fixed shaft can be adjusted manually or controlled by a fixed shaft telescopic device, and the specific diameter and length of the fixed shaft are determined according to the minimum curvature radius and the working size of the display, and the driving system can provide power for variations of the length and radius of the fixed shaft and rolling-up/unfolding of the display.

On the basis of the above technical solution, it should be noted that when the transformation film 21 includes the plurality of transformation units, the length of each transformation unit is shorter than or equal to one-eighth of the minimum circumference of the fixed shaft in a rollable direction of the flexible substrate 1.

In addition, when the radius of the fixed shaft is adjustable, the length of each transformation unit is shorter than or equal to one-eighth of the minimum circumference of the fixed shaft in the rollable direction of the flexible substrate 1.

It should be noted that the flexiblity-rigidity transformation layer 2 may also be applicable to a flexible display device changeable in a folding form or a fixed arc form or other forms.

The flexible display device provided by the embodiment of the present disclosure has the following three working states:

1. in an off state: the display composed of the flexible substrate 1, the display component 3 and the flexiblity-rigidity transformation layer 2 is in a rolled-up state, the flexiblity-rigidity transformation layer 2 is not energized, and the film of the flexiblity-rigidity transformation layer 2 is in a flexiblity state;

2. in an operating state of the display with the maximum size: the fixed shaft is fully unfolded, and the display is in a state of maximum unfolded area. At the moment, the control module 24 outputs an electric signal, all areas of the flexiblity-rigidity transformation layer 2 are energized, the transformation film 21 is transformed from the flexiblity state to the rigidity state, the transformation film 21 is stretched and paved flatly, since the transformation film 21 directly adheres to the flexible substrate 1, the flexible substrate 1 is paved flatly correspondingly, and the effect of planarization of the flexible substrate 1 can be achieved; and 3. in an operating state of the display with the non-maximal size: the fixed shaft is partially unfolded, and only part areas of the display operate. At the moment, the control module 24 outputs part of the electric signal according to working areas of the display, the part of corresponding areas of the flexiblity-rigidity transformation layer 2 are energized, the flexible film in the part of areas is transformed from the flexiblity state to the rigidity state, the part of flexible film is stretched and paved flatly, and due to the fact that the flexiblity-rigidity transformation layer 2 directly adheres to the flexible substrate 1, the flexible substrate 1 is paved flatly correspondingly, and the effect of flattening the flexible substrate 1 can be achieved.

Figure 10:
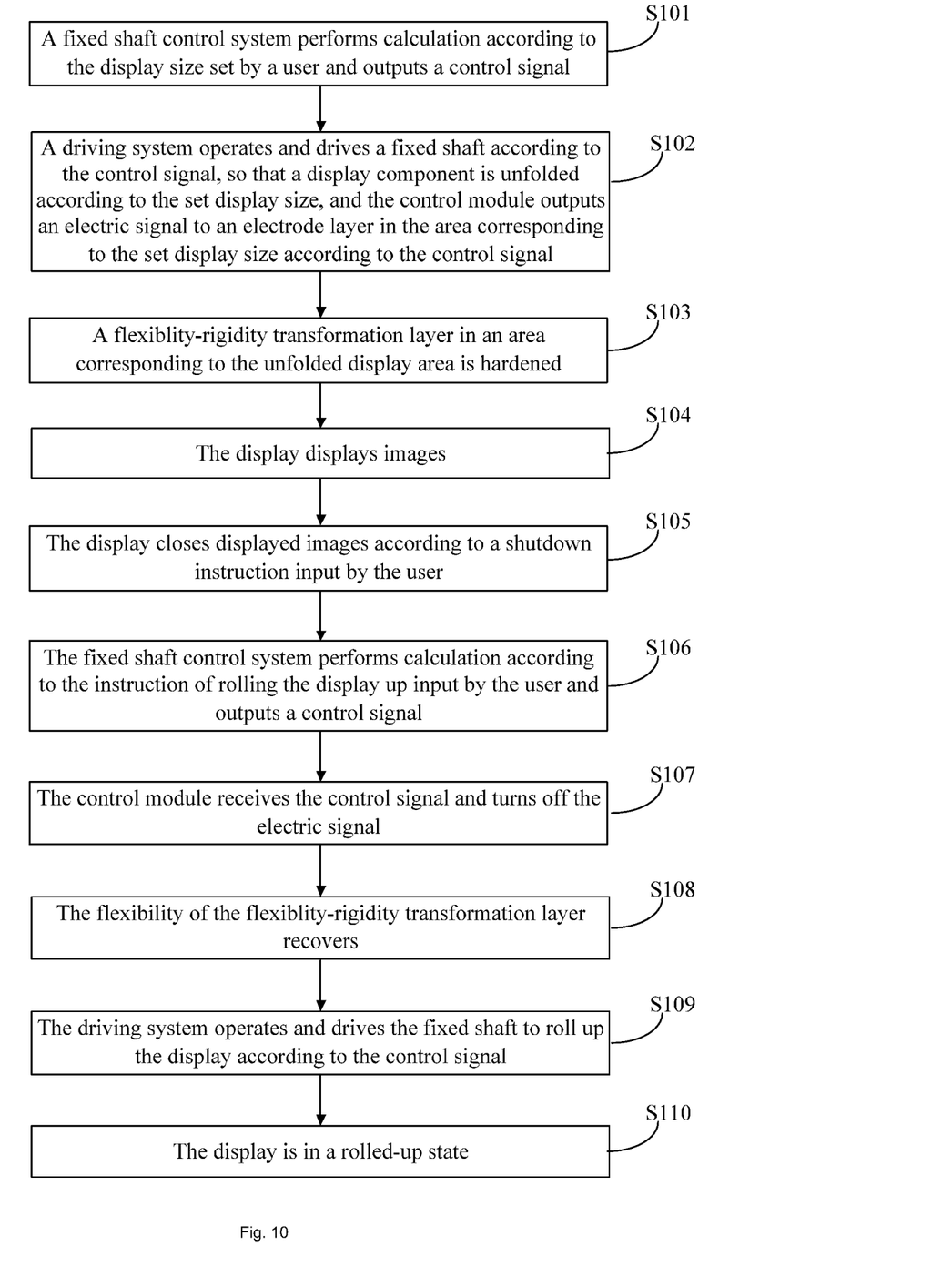
FIG. 10 is a flowchart of the flexible display device provided by an embodiment of the present disclosure.

During specific implementation, the work flow of the flexible display device provided by the present disclosure is as follows, referring to FIG. 10:

S101, a fixed shaft control system performs calculation according to the display size set by a user and outputs a control signal;

S102, a driving system operates and drives a fixed shaft according to the control signal, so that a display component is unfolded according to the set display size, and the control module outputs an electric signal to an electrode layer in the area corresponding to the set display size according to the control signal;

S103, a flexiblity-rigidity transformation layer in an area corresponding to the unfolded display area is hardened;

S104, a display displays images;

S105, the display closes displayed images according to a shutdown instruction input by the user;

S106, the fixed shaft control system performs calculation according to the instruction of rolling the display up input by the user and outputs a control signal;

S107, the control module receives the control signal and turns off the electric signal;

S108, the flexibility of the flexiblity-rigidity transformation layer recovers;

S109, the driving system operates and drives the fixed shaft to roll up the display according to the control signal; and S110, the system is turned off, and the display is in a rolled-up state.

The flexible display device provided by the embodiment of the present disclosure includes the flexible substrate and the flexiblity-rigidity transformation layer formed on one side of the flexible substrate; the flexiblity-rigidity transformation layer includes the transformation film capable of transforming between the flexiblity state and the rigidity state under the action of the electric field, and the electrode layer used for generating the electric field used to drive the transformation film to change. The elastic parameters of the transformation film of the flexible display device provided by the present disclosure can be changed under the action of the electric field, and the flexible layer is changed into the rigid layer, and therefore, planarization of the flexible substrate is achieved. Through transformation of the transformation film, damage of the flexible substrate during repeated rolling-up and unfolding processes can be reduced, so that the service life of the display device is prolonged, and the display quality is improved.

Obviously, those skilled in the art can make various modifications and variations to the embodiments of the present disclosure without departing from the spirit and scope of the present disclosure. Therefore, if the modifications and variations of the present disclosure fall within the scope of the claims of the present disclosure and the equivalent technologies, the present disclosure also intends to include the modifications and variations.

The invention claimed is:

1. A flexible display device, comprising:
a flexible substrate; and
a flexibility-rigidity transformation layer disposed at one side of the flexible substrate, wherein,
the flexibility-rigidity transformation layer comprises an electrode layer and a transformation film capable of transforming between a flexibility state and a rigidity state under an action of an electric field; and the electrode layer is used for generating an electric field for driving the transformation film to transform between the flexibility state and the rigidity state;
the transformation film comprises one transformation unit;
the electrode layer comprises a first electrode layer and a second electrode layer, the first electrode layer and the second electrode layer are disposed on a same side of the transformation film, the first electrode layer comprises a plurality of first electrode units, the second electrode layer comprises a plurality of second electrode units, and the plurality of second electrode units and the plurality of first electrode units are arranged at intervals and are alternately arranged on a same layer.

2. The flexible display device according to claim 1, wherein the flexibility-rigidity transformation layer further includes a planarization layer for improving flatness, and the planarization layer is disposed on one side, facing away from the flexible substrate, of the transformation film and the electrode layer.

3. The flexible display device according to claim 1, wherein the transformation film is made of a dielectric elastic material.

4. The flexible display device according to claim 3, wherein the dielectric elastic material is a silicone rubber polymer material, an acrylate polymer material or a carbon nanotube polymer material.

5. The flexible display device according to claim 1, wherein the flexible display device further comprises a fixed shaft located at one end of the flexible substrate, and the flexible substrate has an unfolded state and a rolled-up state with the fixed shaft as a reel.

6. The flexible display device according to claim 5, further comprising:
   a rolling-up device for controlling the flexible substrate to change between the unfolded state and the rolled-up state; and
   a driving system for driving the rolling-up device to operate.

7. The flexible display device according to claim 5, wherein the fixed shaft is adjustable in size in at least one of a radial direction and an extending direction of the fixed shaft.

8. The flexible display device according to claim 7, wherein when the transformation film comprises the plurality of transformation units, a width of each transformation unit in the rollable direction of the flexible substrate is shorter than or equal to one-eighth of a minimum circumference of the fixed shaft.

* * * * *